(12) United States Patent
Cheng

(10) Patent No.: US 9,709,348 B2
(45) Date of Patent: Jul. 18, 2017

(54) HEAT-DISSIPATING COPPER FOIL AND GRAPHENE COMPOSITE

(71) Applicant: Chang Chun Petrochemical Co., Ltd., Taipei (TW)

(72) Inventor: Kuei-Sen Cheng, Taipei (TW)

(73) Assignee: Chang Chun Petrochemical Co., Ltd., Taipei (TW)

( * ) Notice: Subject to any disclaimer, the term of this patent is extended or adjusted under 35 U.S.C. 154(b) by 0 days.

(21) Appl. No.: 15/288,346

(22) Filed: Oct. 7, 2016

(65) Prior Publication Data

US 2017/0115074 A1 Apr. 27, 2017

Related U.S. Application Data

(60) Provisional application No. 62/246,850, filed on Oct. 27, 2015.

(51) Int. Cl.

| | | |
|---|---|---|
| B21C 37/00 | (2006.01) |
| F28F 13/18 | (2006.01) |
| C25D 3/38 | (2006.01) |
| C25D 1/04 | (2006.01) |
| C23C 28/00 | (2006.01) |
| C23C 24/08 | (2006.01) |
| H05K 7/20 | (2006.01) |
| F28F 21/08 | (2006.01) |
| F28F 21/02 | (2006.01) |

(52) U.S. Cl.
CPC ............ *F28F 13/18* (2013.01); *C23C 24/082* (2013.01); *C23C 28/32* (2013.01); *C23C 28/34* (2013.01); *C25D 1/04* (2013.01); *C25D 3/38* (2013.01); *F28F 21/02* (2013.01); *F28F 21/085* (2013.01); *H05K 7/2039* (2013.01); *F28F 2255/02* (2013.01); *F28F 2275/025* (2013.01)

(58) Field of Classification Search
None
See application file for complete search history.

(56) References Cited

U.S. PATENT DOCUMENTS

| | | | | |
|---|---|---|---|---|
| 5,326,455 A | * | 7/1994 | Kubo ................ | C25D 1/04 204/211 |
| 6,291,081 B1 | * | 9/2001 | Kurabe .............. | C25D 1/04 174/257 |
| 9,287,566 B1 | * | 3/2016 | Chou ................. | H01M 4/661 |
| 9,365,942 B2 | * | 6/2016 | Tsai .................. | C25D 1/04 |
| 9,397,343 B1 | * | 7/2016 | Cheng ............... | H01M 4/70 |

(Continued)

FOREIGN PATENT DOCUMENTS

| | | |
|---|---|---|
| CN | 203032018 U | 7/2013 |
| CN | 103476227 A | 12/2013 |

*Primary Examiner* — Humera Sheikh
*Assistant Examiner* — Seth Dumbris
(74) *Attorney, Agent, or Firm* — Polsinelli PC

(57) ABSTRACT

A method of producing a composite heat dissipating structure by depositing a slurry of graphene particles upon a copper foil, drying the slurry to form a layer of graphene in contact with the copper foil, and consolidating the layer of graphene under pressure to reduce the thickness of the graphene layer and recovering the composite heat dissipating structure. Heat dissipating copper foils and composite heat dissipating structures and electronic devices incorporating the same are also disclosed herein.

24 Claims, 8 Drawing Sheets

(56) References Cited

U.S. PATENT DOCUMENTS

| | | | | |
|---|---|---|---|---|
| 2002/0182433 | A1* | 12/2002 | Endo | C25D 3/58 |
| | | | | 428/606 |
| 2004/0038049 | A1* | 2/2004 | Suzuki | B32B 15/08 |
| | | | | 428/457 |
| 2005/0121229 | A1* | 6/2005 | Takai | B32B 15/08 |
| | | | | 174/261 |
| 2008/0174016 | A1* | 7/2008 | Sato | H05K 1/0346 |
| | | | | 257/741 |
| 2009/0208762 | A1* | 8/2009 | Akase | B32B 15/08 |
| | | | | 428/450 |
| 2012/0142832 | A1* | 6/2012 | Varma | C09D 5/24 |
| | | | | 524/145 |
| 2016/0370133 | A1* | 12/2016 | Liu | F28F 21/081 |

* cited by examiner

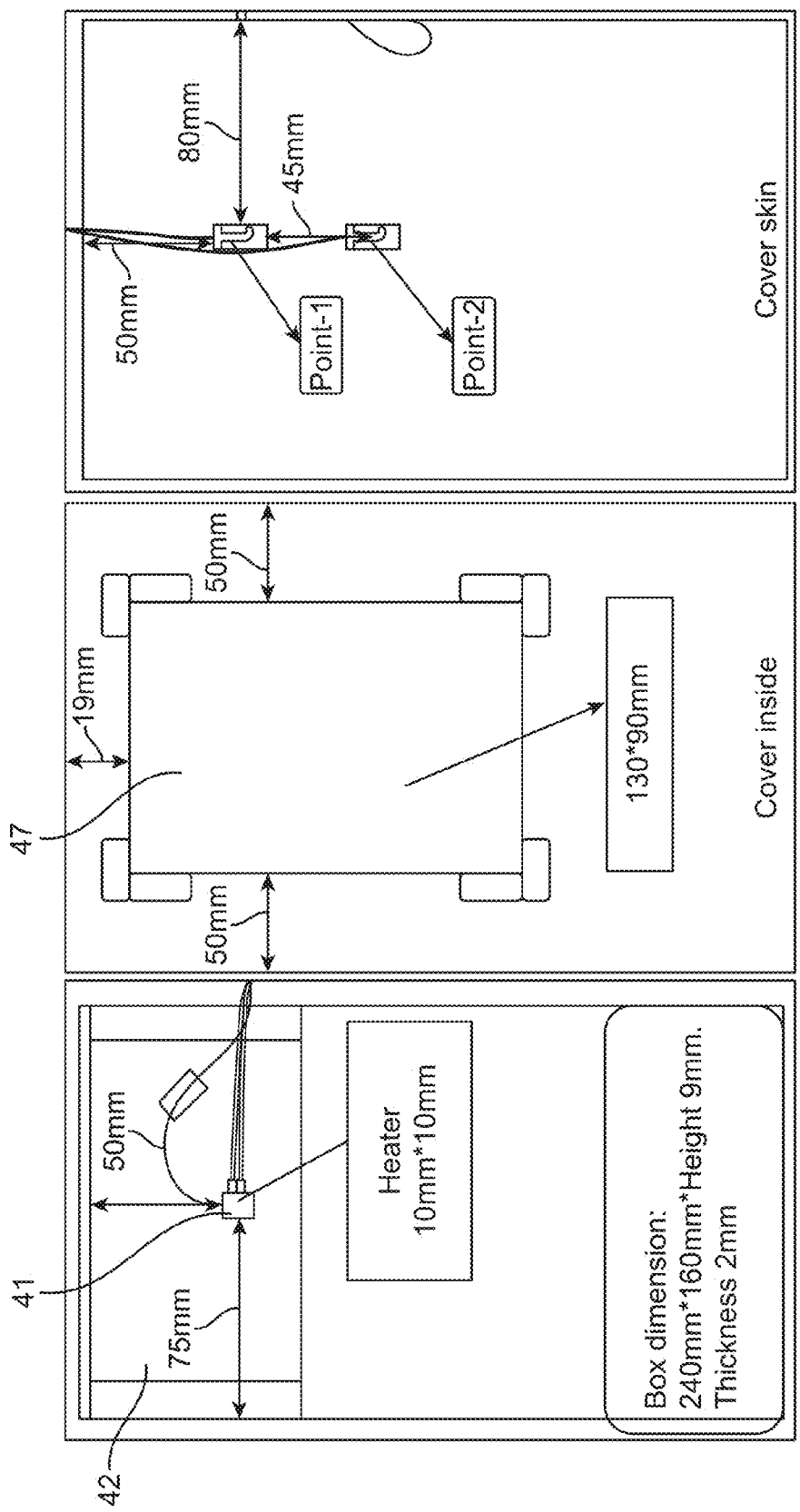

HEAT-DISSIPATING COPPER FOIL AND GRAPHENE COMPOSITE

CROSS REFERENCE TO RELATED APPLICATION

This non-provisional application claims benefit under 35 U.S.C. §119 (e) of U.S. Provisional Patent Application Ser. No. 62/246,850, filed on Oct. 27, 2015, the entire contents of which are herein incorporated by reference in their entirety.

BACKGROUND OF THE INVENTION

1. Field of the Invention

As smart devices, e.g., smartphones and wearables, have become multi-functional and lighter in weight and mass, heat management of the device becomes more and more important. How heat production can be reduced or removed from components, such as transistor, back light module and battery is a crucial task for overall design and structure of these devices. This disclosure is directed to composites of copper foil and graphene, structures embodying the same and methods of heat management of smart devices utilizing these composites and structure in managing heat created by these devices.

2. Description of the Prior Art

Until now, pyrolytic graphite sheets were used as a heat dissipation component. However, pyrolytic graphite sheets are very expensive to manufacture, as well as being very brittle and very easy to crack or shatter. Pyrolytic graphite sheets are made from a polyimide (PI) film by a two-step process. The first step is a carbonization process, which is conducted at a 1000° C.~1400° C. environment, in which the PI film changes color from brown to black. The second step is the graphitization step, which is conducted at 1800° C.-3000° C. environment, in which the carbon atoms rearrange into the graphite structure. Pyrolytic graphite sheets are also very brittle and tend to crack or shatter during transport and handling, especially during handling during installation on electronic devices. The energy costs associated with the high temperatures of production are very costly, especially if there is a high loss rate of the resulting graphite sheets due to cracking. Thus, there exists a need to provide less costly and structurally better alternatives to pyrolytic graphite sheets as a component for heat dissipation.

Graphene production is described in U.S. Pat. No. 7,071,258, the entire disclosure of which is herein incorporated by reference. Graphene can be produced by partially or fully carbonizing a variety of precursor polymers, such as polyacrylonitrile (PAN) fibers and phenol-formaldehyde resin, or heat treating petroleum or coal tar pitch, exfoliating the resulting carbon- or graphite-like structure and mechanical attrition (e.g., ball milling) of the exfoliated structure to become nano-scaled. Although the foregoing patent describes incorporation of the nano-scaled graphene plate (NGP) material into a matrix material to obtain an NGP-reinforced composite, there is no disclosure for making graphene coated metal sheets, and no disclosure of copper foil/graphene composites.

SUMMARY OF THE DISCLOSED EMBODIMENTS

In the detailed description that follows, the same numerical indicia are utilized for common elements, even though shown in different figures of the drawings.

In one embodiment, a heat dissipative copper foil having a copper content greater than 90%; an area weight is in the range of 280 to 900 (g/m$^2$); the copper foil comprising two surfaces, said surface comprising a drum-side and a deposited-side; wherein the deposited-side of the copper foil possesses a surface roughness (Rz) that does not exceed 1.0 μm is disclosed.

In a further embodiment, a heat dissipating component equal in heat dissipating properties to a pyrolytic graphite sheet can take the form of a composite of copper foil and graphene.

In other embodiments, a heat dissipative structure comprises a graphene/copper foil composite film, which composite has a higher flexibility than pyrolytic graphite sheets known to the prior art.

In still further embodiments, smart devices comprise a new class of heat dissipating structures comprising composite copper foil and graphene, which composite structures can be planar in form, or comprise three-dimensional structures to provide heat dissipating surfaces about components of the smart devices, including but not limited to battery, back light modules for displays of the device and other components.

The composite heat dissipating components and structures are less expensive to manufacture and install in smart devices. In addition, because of the increased flexibility of the copper foil-graphene composites, they are easier to handle and assemble than pyrolytic graphite sheets of the prior art and are less prone to breakage in handling and assembly into smart devices.

Furthermore, as the copper foil-graphene composites are easier to rework, the composites can be recycled, extending the useful life of the component and reducing the demands on the environment.

BRIEF DESCRIPTION OF THE DRAWINGS

FIGS. 5A, 5B and 5C are a schematic illustration of the various parts of the heat dissipation testing apparatus of FIG. 4;

Figure 1:
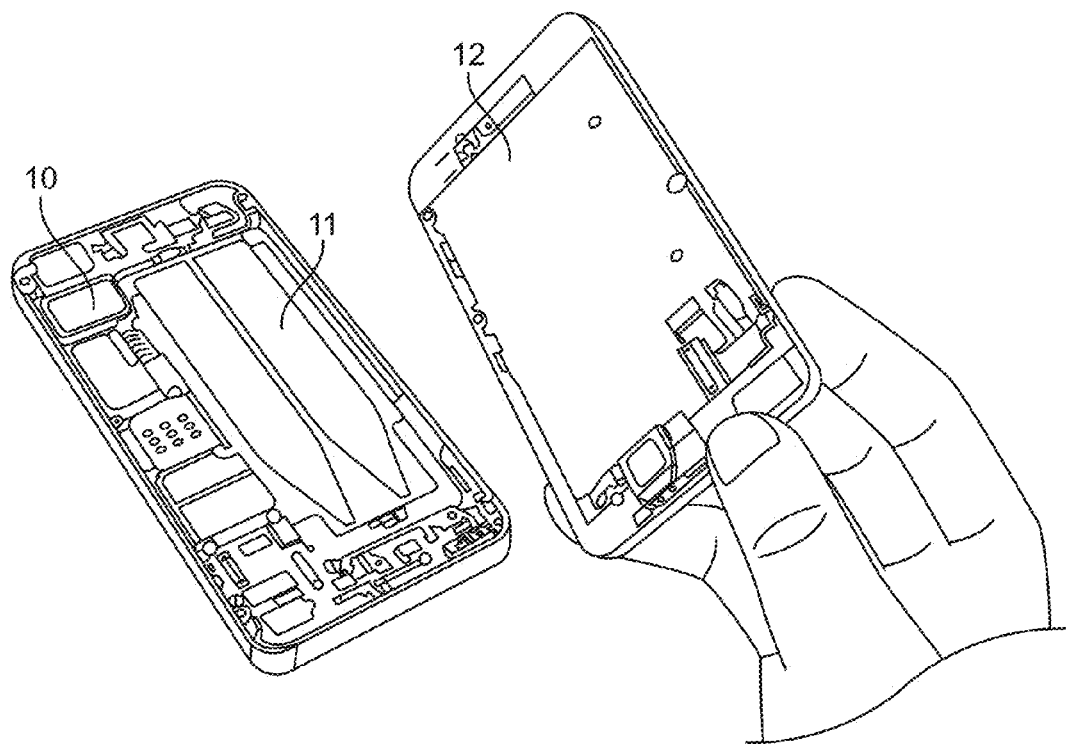
FIG. 1 (Prior Art) is a photograph of the placement of pyrolytic graphite sheets in an iPhone 4s.

It should be understood that the various aspects are not limited to the arrangements and instrumentality shown in the drawings.

DETAILED DESCRIPTION OF THE EMBODIMENTS

As seen in FIG. 1 (Prior Art), which is a photograph of an opened the Apple I Phone 4s, pyrolytic graphite sheets 10, 11, 12 are used to shield the components of the phone from excess heat. Such areas of excess heat in this phone include transistor, back light module and battery (all not shown) as being covered by one of the pyrolytic graphite sheet 10, 11 and 12.

Pyrolytic graphite sheets are very expensive to manufacture due to the high costs of energy necessary to change a carbonaceous film, such as a polyimide (PI) film, into the pyrolytic graphite sheet as discussed above.

Moreover, the resulting pyrolytic graphite sheets are very brittle and easy to break. Once broken, the pyrolytic graphite sheets are unsuitable for their intended purpose (heat dissipation) and must be scrapped, resulting in a total loss of the raw materials and high cost of energy utilized to manufacture the pyrolytic graphite sheet.

The inventors have discovered alternative materials having all the heat dissipative properties of pyrolytic graphite sheets, but none of the drawbacks. The alternative materials are low in cost to manufacture, have far more flexibility than the pyrolytic graphite sheets of the prior art and can therefore be shaped as three dimensional structures, and even if damaged are recyclable, thereby recovering the raw materials utilized in their manufacture.

Figure 2:
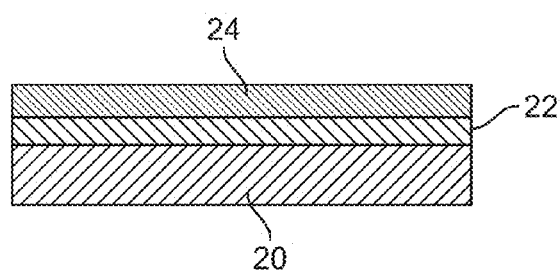
FIG. 2 is a schematic illustration of a single side coated graphene/copper foil composite.

In one embodiment, the alternative material comprises a graphene/copper foil composite film. The composite is illustrated in FIG. 2, wherein 20 illustrates the copper foil of the composite, and 22 illustrates the graphene layer. As an expedient for applying the composite in the desired area of electronic devices, including smart phones, wearables and other high heat producing/shielding areas of electronic devices, is also an optional layer of adhesive 24 to bond the composite to a desired area of the device.

Figures 6A, 6B:
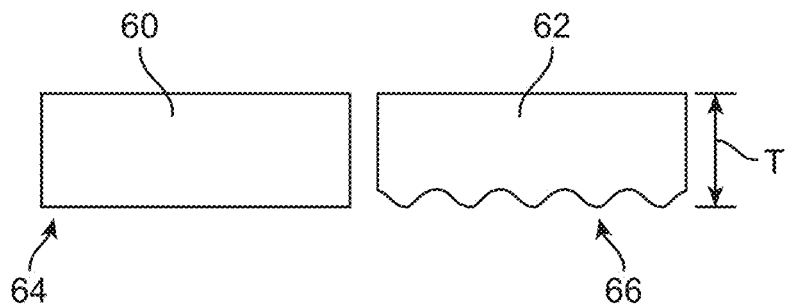
FIG. 6A is a schematic illustration of a copper foil having a low surface roughness (Rz)
FIG. 6B is a schematic illustration of a copper foil having a greater surface roughness (Rz) than the copper foil of FIG. 6A.

As space is limited in electronic devices, the thickness of the copper foil is limited. However, when providing copper foil produced as an electrodeposited (ED) copper foil, the side opposite the cathode drum, i.e., the side of the copper foil adjacent the electrolyte bath, known as the deposited side usually has a surface roughness greater than the side of the foil that was adjacent the cathode drum, known as the drum side. As the surface of the cathode drum can be controlled by polishing, to a mirror finish if desired, the deposited side presents a roughened surface 66 as shown schematically in FIG. 6B. As compared to a much smaller surface roughness (Rz) 64 (shown in FIG. 6A), for the same thickness of copper foil, the foil 60 of FIG. 6A contains more copper than the foil 62 of FIG. 6B. The copper foil 60 of FIG. 6A, having a higher copper content[1] for the same thickness, as compared to copper foil 62 of FIG. 6B, is a better dissipater of heat, than the copper foil 62 of the same thickness T.

[1] Copper content (%)=[area weight (g/m$^2$)/thickness (μm)×8.96]×100>90; where thickness is measured by a micrometer.

The inventors have found that the best surface roughness (Rz) of the drum side of copper foils in the composite is in the range of 0.5 to 2.5 μm. If the surface roughness (Rz) is lower than 0.5, not only is there poor adhesion between the copper foil and graphene layer, but also the surface area is lower, such that heat dissipation is low and unacceptable. On the other hand, if the surface roughness (Rz) is greater than 2.5 μm, the copper content of the foil is too low, such that heat dissipation is also low and unacceptable.

It should be understood that the range of 0.5 to 2.5 μm is indicative of the broadest range, but it is to be expressly understood that ranges having 0.6; 0.7; 0.8; 0.9; 1.0; 1.1; 1.2; 1.3; 1.4; 1.5; 1.6; 1.7; 1.8; 1.9; 2.0; 2.1; 2.2; 2.3 and 2.4 μm may be the minimum or maximum ends of the range, as well as the absolute surface roughness (Rz) of any particular drum side of the copper foil used in the composite.

On the other hand, the surface roughness (Rz) of the deposited side of the copper foil should be in the range of 0.3-1.0 μm. When the surface roughness (Rz) of the deposited side is in the lower end of this range, the coating of graphene layer is more uniform, but if the surface roughness (Rz) of the deposited side is lower than 0.3 μm, the adhesion between the copper foil and the graphene layer is poor. It should be understood that the range of 0.3 to 1.0 μm is indicative of the broadest range of surface roughness for the deposited side of the copper foil, but it is to be expressly understood that ranges having 0.35; 0.4; 0.45; 0.5; 0.55; 0.6; 0.65; 0.7; 0.75; 0.8; 0.85; 0.9 and 0.95 μm may be the minimum or maximum ends of the range, as well as the absolute surface roughness (Rz) of any particular deposited side of the copper foil used in the composite.

Figure 7:
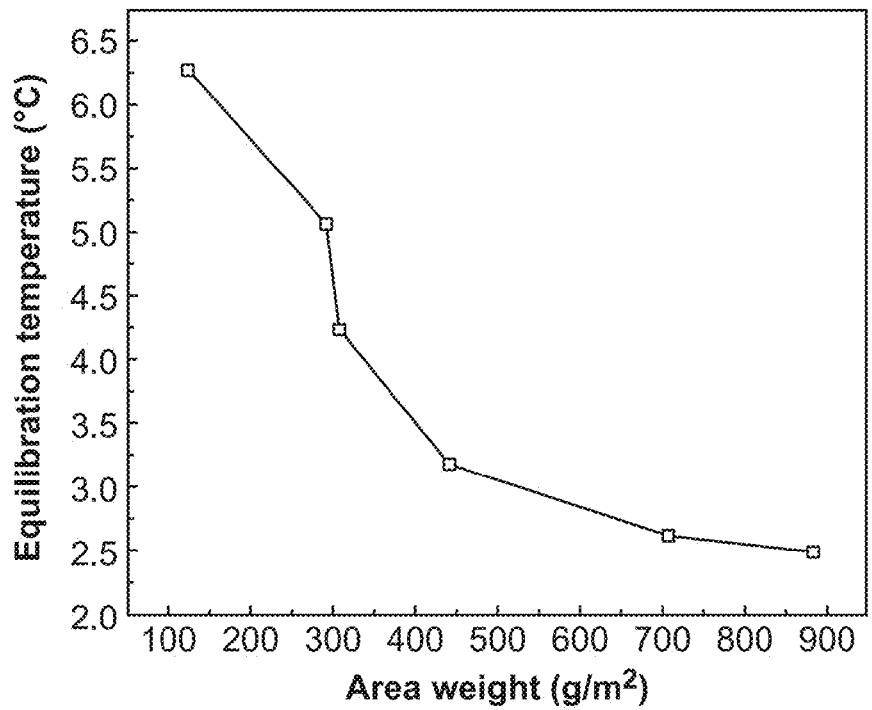
FIG. 7 is a graphical representation of the Equilibration Temperature (in ° C.) versus Area Weight (in g/m$^2$)
Figure 9:
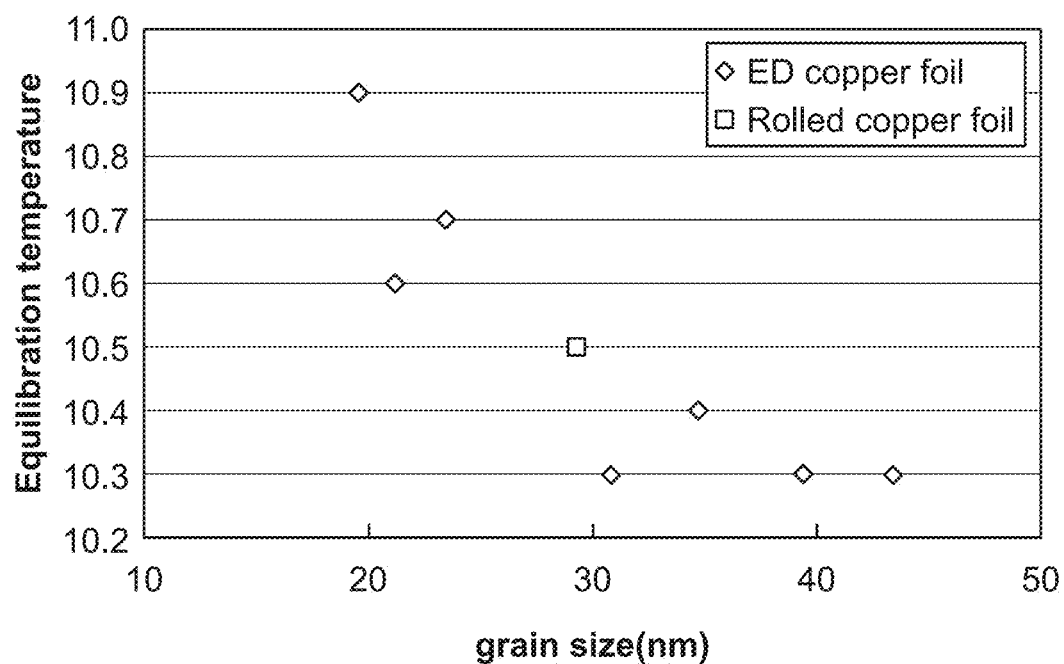
FIG. 9 is a graphical representation of a comparison of an electrodeposited (ED) copper foil (without graphene layer) versus a rolled copper foil (without graphene layer), each with an adhesive layer of Equilibration Temperature (in ° C.) versus grain size (in nm)
Figure 10:
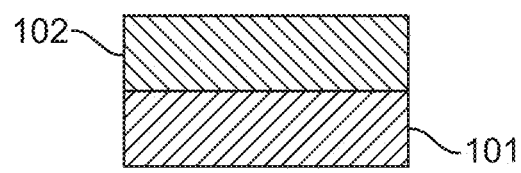
FIG. 10 is a schematic illustration of the ED copper foil and adhesive layer tested in the graphical representation of FIG. 9.

In one embodiment, as shown in FIG. 2, the thickness of the adhesive layer 24 is 30 μm; the thickness of the graphene layer 22 is 15 μm, and only the copper layer 20 is allowed to vary. As shown in the graphical representation of FIG. 7, thicker copper foils have the best heat dissipation values, especially where the copper content of the copper foil 20 is high. It is to be understood, in connection with FIG. 7, only copper foil thickness is being varied with constant graphene layer thickness to show the variation only attributable to different copper foil thicknesses. When compared to a rolled copper foil in FIG. 9, electrodeposited (ED) copper foil having a grain size[2] in the range of 30-45 nm gave good equilibration temperature, both as to ED foils having smaller grain sizes and rolled copper foil. It should be understood that the range of 30 to 45 nm is indicative of the broadest range, but it is to be expressly understood that ranges having 31; 32; 33; 34; 35; 36; 37; 38; 39; 40; 41; 42; 43 and 44 nm may be the minimum or maximum ends of the range, as well as the absolute grain size of any particular foil used in the composite. It should be further understood that in the graph of FIG. 9, only the copper foil 101 and adhesive 102 (as illustrated in FIG. 10) was used in the test, without the graphene layer, such that the properties of the copper foil could be evaluated. One can adjust the electrodeposition conditions (for example, organic additive concentration, current density, temperature of solution in electrolyte bath) to control the crystal grain size of electrodeposited (ED) copper foil. When the copper foil has a large grain size, it exhibits good heat dissipation properties. The inventors theorize that the good heat dissipation properties exist because there are less grain boundaries than in copper foils having smaller crystal grain size.

[2] The grain size was calculated from XRD (X-ray diffraction) peaks by Scherrer equation (D (grain size)=Kλ/B cos θ), where λ is wavelength (Å), B is FWHM (radians) corrected for instrument broadening, θ is Bragg angle, K is a crystal shape factor from 0.9~1.

Figure 11A:
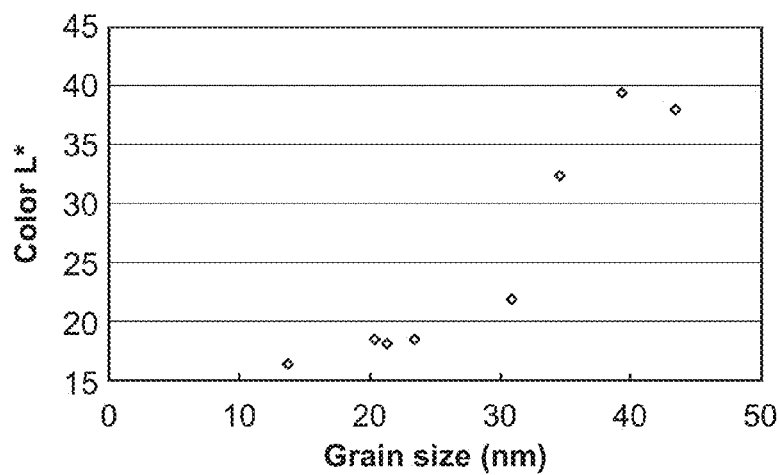
FIGS. 11A, 11B and 11C are graphical representation of color L*; color a* and color b*, respectively versus grain size (in nm) of the deposited side of an ED copper foil.
Figure 11B:
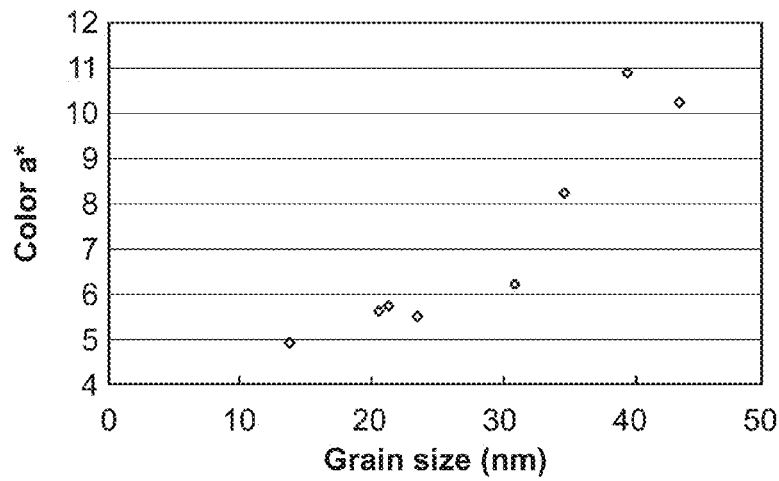
Figure 11C:
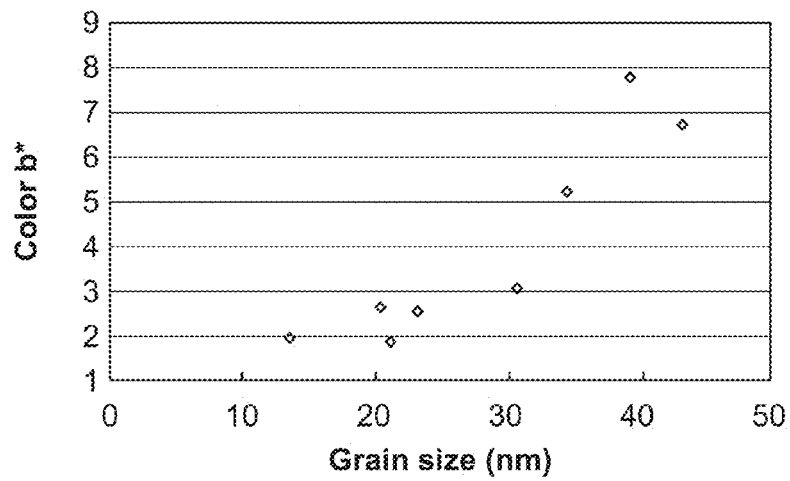

FIGS. 11A, 11B and 11C, respectively are graphical illustrations of the Color L*; Color a* and Color b* versus grain size for the deposited side color. When the grain size is larger than 30 nm, the copper foil has good heat dissipation. Specific deposited side Color L* is in the range of 20-40 in FIG. 11A. Deposited side Color a* is in the range of 6-11 in FIG. 11B and deposited side Color b* is in the range of 3-8 in FIG. 11C. The color of an object generally relates to three factors: brightness (lightness) L*, hue (color shade) a*, and chroma (clearness) b*. For accurately measuring and expressing these factors, a colorimetric system to objectively express them as values is used. The L*a*b* colorimetric system is a colorimetric system described in JIS Z 8729.

When a layer of graphene is added to the copper foil, the heat dissipation of graphene/copper foil composite is equivalent to a pyrolytic graphite sheet. Not only are the properties of heat dissipation equivalent, but the cost of producing the composite graphene/copper film are far less than the cost of providing a pyrolytic sheet of equivalent heat dissipation properties.

Additionally, pyrolytic graphite sheets are quite brittle and may be cracked or otherwise damaged in shipping/handling and installation into electronic devices. The composite graphene/copper foils are much more flexible than the pyrolytic graphite sheets of the prior art and are less prone to cracking during handling and installation. If damaged, the pyrolytic graphite sheets of the prior art have to be discarded, whereas the composite graphene/copper foil of the embodiments can be, if damaged, be recycled to recover their components. Given that high heat campaigns are necessary to produce the pyrolytic graphite sheet, the energy expended in producing the pyrolytic graphite sheets of the prior art is lost once the pyrolytic graphite sheet is damaged and can never be recovered.

Graphene has an outstanding heat conductive performance, which generates rapid and homogeneous diffusion of heat by coating graphene on a substrate. When the substrate is a copper foil as in the disclosed embodiments, each component provides heat dissipative functions. Meanwhile, the graphene coating forms a scale structure which provides heat radiation improving radiation area and efficiency, thereby greatly reducing the temperature.

In the embodiments of this disclosure, the composites can take several forms.

Figure 12A:
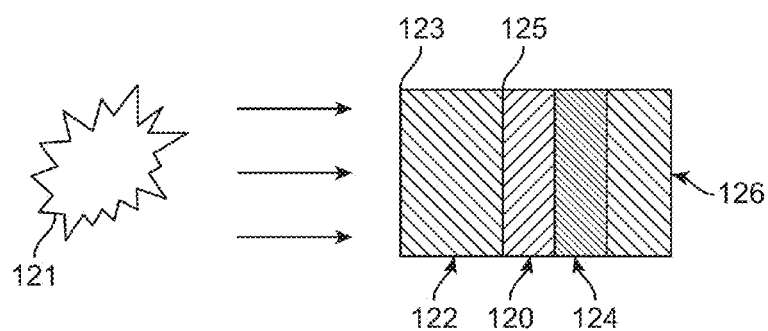
FIGS. 12A and 12B are schematic representations, respectively, for heat dissipation as conducted through a copper foil with a single side coating of graphene; and, a copper foil with a double side coating of graphene.

According to one embodiment of the invention illustrated in FIG. 12A, a single layer of graphene 120 can be coated on an electrodeposited copper foil 122. A heat conductive adhesive 124 can be applied on the graphene layer 120 in order to adhere the copper foil/graphene composite to a portion of an electronic device 126. In some cases, a heat conductive adhesive layer can be applied on the copper foil side of graphene coated copper foil. In this instance a source of heat 121 faces the copper foil, is readily adsorbed by and transfers along the dimensions of the copper foil 122, and is dissipated by the graphene layer 120 before it can affect the portion of the electronic device 126 which it is protecting. In this embodiment, it is preferred to lower the surface roughness (Rz) on each side 123, 125 of copper foil 122. The surface roughness (Rz) on the drum side 123, is controlled by polishing the cathode (drum) surface. The surface roughness (Rz) of the deposited side 125, adjacent the graphene layer 120, is controlled by adding organic additives to a copper sulfate electrolyte solution from which the electrodeposited copper foil 122 is formed. In this embodiment, the deposited side 125 surface roughness (Rz) is lower than the drum side 123 surface roughness (Rz), so it is better to coat the graphene layer on the deposited side of the ED copper foil and have the drum side of the copper foil to face the heat. Control of the surface roughness (Rz) as described above is required, not only to control the adhesion between the graphene layer 120 and copper foil 122, but also to assure adequate copper content in the copper foil 122 to absorb the heat.

Copper foil easily absorbs the heat, and the graphene layer easily conducts and radiates the heat. In a single graphene coating on copper foil embodiment, it is better to have the copper foil face the heat source. In order to maximize the copper content of the copper foil utilized in the heat dissipating composite structures, it is preferable to control or reduce the surface roughness (Rz) of both the drum and deposited sides of the ED copper foil. While the surface roughness of the drum side of the ED copper foil can be controlled by polishing the cathode drum surface on which the drum side of the copper foil is electrodeposited, the deposited side surface roughness (Rz) is controlled by adding organic additives to the copper sulfate electrolyte solution from which the copper foil is formed. When the deposited side roughness is lower than the drum side, it is better to form the graphene layer on the deposited side of the copper foil and have the drum side of the copper foil face the heat source.

Figure 12B:
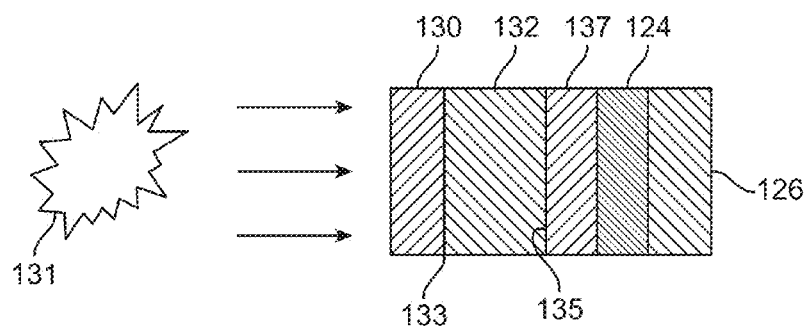

In another embodiment illustrated in FIG. 12B, the copper foil 132 has a double coating of graphene 130, 137 on both the drum side 133 and deposited side 135 thereof. A source of heat 131 directly faces one layer of graphene 130. The heat dissipation performance of a double side coating of graphene on copper foil is better than a single layer coating, but considering the expense of the cost of graphene utilized in a double layer coating, a single layer coating appears to provide adequate protection.

In the embodiment of FIG. 12B, the heat conductive adhesive 124 can be applied on graphene layer 137 in order to adhere the copper foil/graphene composite to a portion of an electronic device 126. When a double side coating of graphene on copper foil is produced, both coatings can be applied and simultaneously dried, and thereafter consolidated. Alternatively, each side coating can be applied sequentially, with drying intermediate the application of each coating. Consolidation is best if performed simultaneously on both graphene coating layers after drying.

Figure 3:
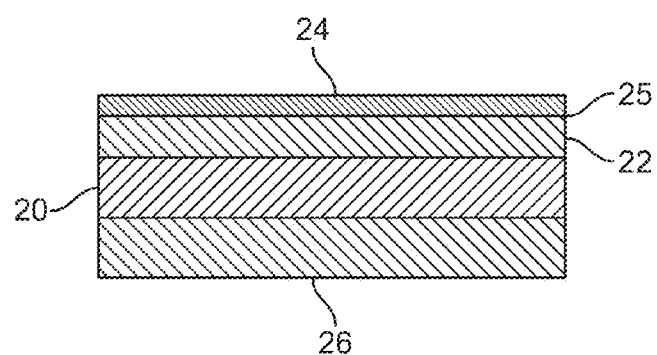
FIG. 3 is a schematic illustration of a double side coated graphene/copper foil/graphene composite.

FIG. 3 is illustrative of a composite heat dissipative composite structure where, in particular instances, when ultimate heat protection is necessary, the embodiment of the double side coating satisfies the need for maximum heat dissipation performance. In FIG. 3, the copper foil 20 is in contact with a graphene layer 22, preferable on the deposited side thereof. A layer of adhesive 24, as in FIG. 2, is also present on a surface 25 of the graphene layer 22 in FIG. 3, opposite the interface of the graphene layer 22 and the deposited side of copper foil 20. A second graphene layer 26 can be present on the drum side of copper foil 20 as illustrated in FIG. 3.

Figure 4:
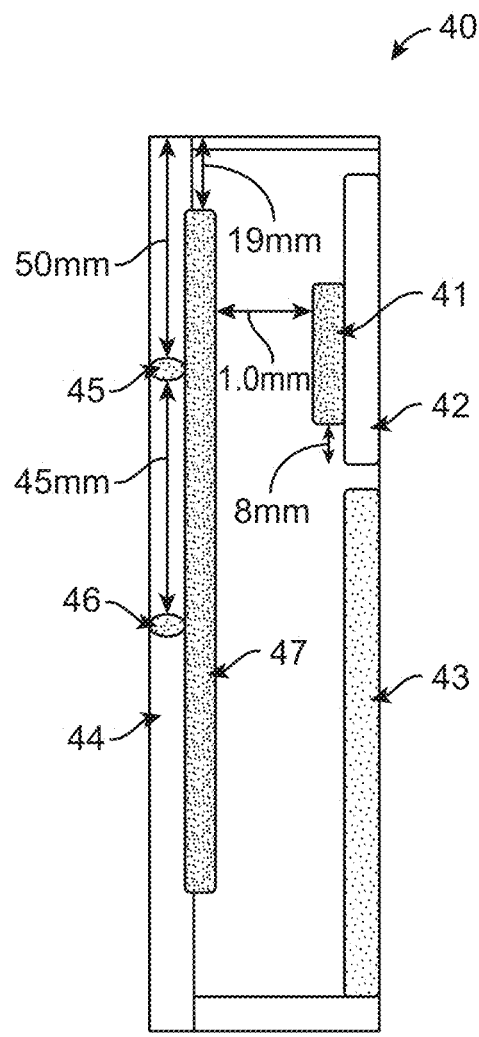
FIG. 4 is a schematic illustration of a heat dissipation testing apparatus.

FIG. 4 is illustrative of a side view of a typical heat dissipation test apparatus 40. A heater 41 (typical dimensions of 10×10×0.125 mm) is placed on a 2 mm thick acrylic sheet covered with 0.1 mm of copper foil (total thickness of element 42 being 2.1 mm) to simulate a motherboard 42. A second 2 mm thick acrylic sheet (also covered with a 0.1 mm copper foil) is used to simulate a battery 43. A 2 mm thick acrylic sheet 44 is used to simulate the cover of an electronic device. Thermal sensors are provided at Point 1 (45) and Point 2 (46) to measure temperatures. A heat dissipating sheet 47 protects thermal sensors 45 and 46 from the effects of heater 41. The heater 41 is operated at a power of 3.4 W to yield a temperature equilibration time of 20 minutes.

FIGS. 5A, 5B and 5C, illustrate, respectively the components of the illustration of FIG. 4, wherein FIG. 5A contains heater 41 on simulated motherboard 42. FIG. 5B illustrates the heat dissipating sheet 47, while FIG. 5C is the other side view as FIG. 5B, having the thermal sensors 45 and 46 at Point 1 and Point 2, respectively. The heat dissipating sheet 47 in FIG. 5 B is the single side graphene layer on the deposited side of a copper foil with a layer of adhesive on the graphene surface facing away from the copper foil. It has been found that a graphene surface to which adhesive is to be applied should preferably have a surface roughness (Rz) larger than 1.5 µm.

Equilibration Temperature=Point-1 Temperature–Point-2 Temperature. The lower the Equilibration Temperature, the better.

Figure 8:
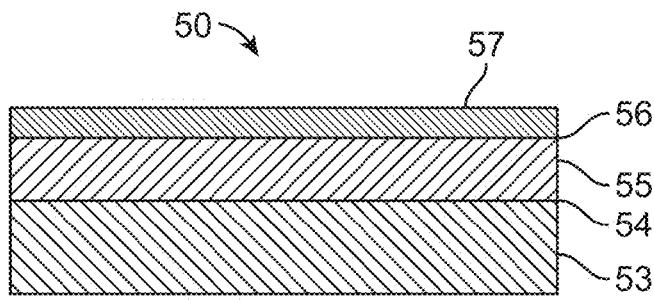
FIG. 8 is a schematic representation of a copper foil-graphene composite plus an additional adhesive layer.

In the embodiment of FIG. 8, which is a single graphene layer/copper foil composite 50, a single graphene layer 55 is applied to the deposited side 54 of copper foil 53. The surface 56 of the graphene layer 55 (opposite the interface between the copper foil and graphene layer) has a surface roughness (Rz) larger than 1.5 µm so as to provide good surface adhesion with adhesive layer 57. The adhesive layer 57 facilitates the application of the copper foil/graphene composite in various portions of an electronic device. Such electronic devices include portable computing devices, such as smartphones, tablets, notepads and similar devices where heat dissipation is required without unnecessarily adding to the weight or bulk of the electronic device.

Figure 13A:
FIGS. 13A, 13B and 13C, respectively, schematically illustrate three different surface roughness (Rz) embodiments of a copper foil surface; and, FIG. 14 is a photograph of a copper foil illustrating de-wetting of an aqueous slurry of graphene.
Figure 13B:
Figure 13C:

The embodiments shown in FIGS. 13A, 13B and 13C, respectively, schematically illustrate three different surface roughness (Rz) embodiments of a copper foil surface can influence the surface area of the copper foil surface.

FIG. 13A-illustrates a high roughness, middle gloss and having a middle surface area; FIG. 13B—illustrates high roughness, low gloss having a large surface area; and FIG. 13C—illustrates low roughness, high gloss having a small surface area.

A surface roughness (Rz) of drum side is best in the range of 1.1 to 2.5 µm and the MD (machine direction) gloss is best lower than 180 at a light incident angle of 60°.

The significance of the various surface roughness values for the drum side is as follows:

if the copper foil has surface roughness (Rz) larger than 2.5 µm, the copper content of the foil will be lower, and the heat dissipation performance will be poor; and, if the MD gloss of drum side of the copper foil is larger than 180 at a light incident angle of 60°, the surface area will be small, and the absorption of heat will be poor.

If the copper foil of two samples, (a) and (b), had the same surface roughness (Rz), but (b) had a lower MD gloss than (a), (b) would have a larger surface area than (a). When a copper foil has a higher surface roughness (Rz) and a lower MD gloss on its drum side, it means the surface area of the drum side is larger and it has a good performance in its absorption of heat. However, it should be understood that gloss and surface roughness (Rz) are not inverse relationships. When moderate uneven surge does not occur on the roughness surface and hence uniform low surface roughness (Rz) is provided, the appearance is glossy. On the other hand, when moderate uneven surge occurs on the roughness surface and hence, uniform low surface roughness (Rz) is not provided, the appearance is semi-glossy or drab.

The surface roughness (Rz) of the deposited side is best in the range of 0.3 to 1.0 µm.

The significance of the various surface roughness values for the deposited side is as follows:

When the surface roughness (Rz) of the deposited side is lower, the coating of graphene layer is more uniform, but if the surface roughness (Rz) of the deposited side is lower than 0.3 µm, the adhesion between the copper foil and the graphene layer is poor.

The slurry for coating a graphene layer is very similar to the anode slurry for lithium ion battery. The slurry can be a solvent slurry or an aqueous slurry. For heat dissipation sheet application, an aqueous slurry is better, because an aqueous slurry is low in cost, safe and environmentally friendly. After drying, if the graphene layer contains significantly less residual water, it is not harmful to a composite heat dissipation sheet, but would be harmful to a lithium ion battery.

Figure 14:
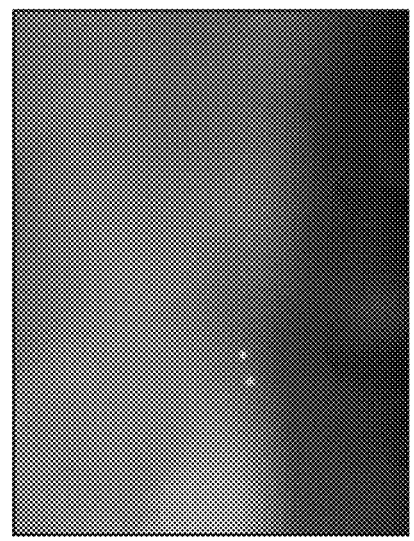

Because an aqueous slurry is a good choice, in order to have high affinity to the aqueous slurry, the copper foil surface should have a high surface tension, the higher the surface tension, the better. If the surface tension of the copper foil surface is too low, after slurry coating, it is easy to have a dewetting effect. Such is shown in the photograph of FIG. 14, where the white spots in the lower right-hand quadrant indicate dewetting.

The best surface tension of a copper foil surface is in the range of 44 to 68 dyne/cm. If the surface tension of the copper foil is lower than 44 dyne/cm, the styrene-butadiene rubber ("SBR") acting as the aqueous binder is easy to concentrate and dispersibility is poor.

When a copper foil surface has low surface roughness (Rz) it has more affinity to an aqueous slurry.

The following general observations have been noted:

A graphene slurry was coated on the surface of a copper foil and dried in an oven maintained at 90° C. After drying, the graphene layer is not dense, air is in the graphene layer, and heat conductivity is not good. However, under pressure consolidation, the graphene layer becomes dense, air voids are reduced or eliminated and heat conductivity is acceptable, such that the composite copper foil/consolidated graphene layer has the comparable properties to pyrolytic graphene sheets.

If lightness L* of the graphene layer surface is high, the graphene material densely exists (the amount of voids is small) and the reflectivity is high. If lightness L* is too high, the heat conductivity of the graphene layer is good, but heat radiation is poor. If lightness L* is too low, the amount of voids is great, heat conductivity of the graphene layer is poor, but heat radiation is better than the result where lightness L* is high.

Thus, the best lightness L* of the graphene layer surface is in the range of 20 to 60.

The best thickness of the graphene layer is in the range of 3 to 50 µm. If the graphene thickness is lower than 3 µm, the graphene layer cannot cover the copper foil surface completely and heat conductivity is bad. When the graphene layer thickness exceeds 50 µm, the cost is high and the increase in heat dissipation is not significant.

The best surface roughness (Rz) of the graphene layer is larger than 1.5 µm. When surface roughness (Rz) is greater 1.5 µm, the graphene layer has good heat radiation properties.

EXAMPLES

Example 1

Manufacture of Electrodeposited Copper Foil

Copper wires were dissolved in a 50% sulfuric acid aqueous solution to prepare a copper sulfate electrolyte containing 320 g/l of copper sulfate ($CuSO_4 \cdot 5H_2O$) and 100 g/l of sulfuric acid. To per litter of the copper sulfate electrolyte, 7.97 mg of gelatin (2CP:25 Koei Chemical Co., Ltd.), 4.33 mg of sodium 3-mercapto-1-propanesulfonate (MPS:HPOPAX Company), 1.5 mg of Janus green B (JGB), and 35 mg chloride ion were added. Subsequently, an electrodeposited copper foil with thickness of 35 μm was prepared at the liquid temperature of 50° C. and a current density of 50 A/dm². After 35 μm electrodeposited copper foil was produced, the surface of the electrodeposited copper foil was treated with Zn/Cr plating, Cr plating or Cr dipping to prevent oxidation. The surface tension of the copper foil can be adjusted by changing the condition of Zn/Cr or Cr treatment, for example, by altering the pH of the Cr treatment solution.

TABLE 1

| | | Surface treatment condition of Example 1 | | |
|---|---|---|---|---|
| $CrO_3$ (g/l) | pH | Current Density (A/dm²) | Time (sec.) | Temperature of Solution (° C.) |
| 1.5 | 2.03 | 0.5 | 2 | 25 |

Coating the Electrodeposited Copper Foil

An aqueous graphene slurry was prepared by using water as a solvent and the materials listed in Table 2 below with a solid-liquid ratio of 73% (73 g of solid materials; 100 g of water).

TABLE 2

| Solid Material | % Based on Total weight of Solid Materials |
|---|---|
| Graphene Powder | 88 wt. % |
| Conductive Additive (Conductive Carbon Black; Super P ®) | 3 wt. % |
| Conductive additive (Graphite; KS6) | 3 wt. % |
| Water-Based Adhesive Binder (Styrene-Butadiene Rubber; SBR) | 2 wt. % |
| Thickening Agent (Carboxymethyl Cellulose; CMC) | 4 wt. % |

After the components of the solid material formulation were mixed, the graphene material slurry was coated on the surface of the deposited side of copper foil at a speed of 5 meters per minute to a thickness of 30 μm and then dried through a 90° C. oven. Graphene may be generally produced by a mechanical exfoliation method, a chemical exfoliation method, a redox method, but the instant disclosure and claims are not so limited. Graphene is at least one selected from the group of mono-layer graphene, multi-layer graphene, graphene oxide, reduced graphene oxide, and graphene derivatives, however the instant disclosure and claims are not so limited.

Pressing the Graphene/Copper Foil Composite

After the graphene layer on the copper foil surface was dried, the graphene/copper foil composite was pressed. The dimension of the rollers of the pressing machine were ϕ250 mm×250 mm, hardness of the rollers was 62~65° HRC, and the roller material was high-carbon chrome bearing steel (SUJ2). The graphene/copper foil composite was pressed by 1 M/min pressing speed and 1000 kg pressure until the thickness of graphene layer became 15 μm (half its original thickness).

The following examples are illustrative of the various aspects of the invention.

TABLE 3

| | | | | | | | Example | | | | | |
|---|---|---|---|---|---|---|---|---|---|---|---|---|
| | Conditions | 1 | 2 | 3 | 4 | 5 | 6 | 7 | 8 | 9 | 10 | 11 |
| Manufacture of electrodeposited copper foil (Raw copper foil) | copper sulfate ($CuSO_4 \cdot 5H_2O$) (g/l) | 320 | 320 | 320 | 320 | 320 | 320 | 320 | 320 | 320 | 320 | 320 |
| | sulfuric acid ($H_2SO_4$) (g/l) | 100 | 100 | 100 | 100 | 100 | 100 | 100 | 100 | 100 | 100 | 100 |
| | chloride ion (mg/l) | 35 | 35 | 35 | 35 | 35 | 35 | 35 | 35 | 35 | 35 | 35 |
| | temperature (□) | 50 | 50 | 50 | 50 | 50 | 50 | 50 | 50 | 50 | 50 | 50 |
| | current density (A/dm²) | 50 | 50 | 50 | 50 | 50 | 50 | 50 | 50 | 50 | 50 | 50 |
| | gelatin (2CP) concentration(mg/l) | 7.97 | 6.38 | 7.97 | 7.97 | 6.38 | 6.38 | 7.97 | 4.78 | 7.97 | 7.97 | 7.97 |
| | sodium 3-mercapto-1-propanesulfonate concentration (MPS) (mg/l) | 4.33 | 3.46 | 4.33 | 4.33 | 3.46 | 3.46 | 4.33 | 2.60 | 4.33 | 4.33 | 4.33 |
| | Janus green B (JGB) concentration (mg/l) | 1.50 | 1.20 | 1.50 | 1.50 | 1.20 | 1.20 | 1.50 | 0.90 | 1.50 | 1.50 | 1.50 |
| | polishing pressure of buff (A) | 1 | 1 | 2 | 2 | 1 | 1 | 1 | 1 | 1 | 1 | 1 |
| | speed of buff (rpm) | 300 | 300 | 300 | 300 | 300 | 300 | 300 | 300 | 300 | 300 | 300 |
| | mesh size of buff | 1500 | 1500 | 800 | 1000 | 1500 | 1500 | 1500 | 1500 | 1500 | 1500 | 1500 |

TABLE 3-continued

| | Conditions | \multicolumn{11}{c}{Example} |
| | | 1 | 2 | 3 | 4 | 5 | 6 | 7 | 8 | 9 | 10 | 11 |
|---|---|---|---|---|---|---|---|---|---|---|---|---|
| Surface treatment of electrodeposited copper foil (anti-tarnish treatment) | CrO$_3$ (g/l) | 1.5 | 1.5 | 1.5 | 1.5 | 5 | 1.5 | 1.5 | 1.5 | 1.5 | 1.5 | 1.5 |
| | pH | 2.03 | 2.03 | 2.03 | 2.03 | 1.02 | 3.20 | 2.03 | 2.03 | 2.03 | 2.50 | 2.50 |
| | Temperature (□) | 25 | 25 | 25 | 25 | 25 | 25 | 25 | 25 | 25 | 25 | 25 |
| | Current Density(A/dm$^2$) | 0.5 | 0.5 | 0.5 | 0.5 | 0.5 | 0.5 | 0.5 | 0.5 | 0.5 | 0.5 | 0.5 |
| | Time (Sec) | 2 | 2 | 2 | 2 | 2 | 2 | 2 | 2 | 2 | 2 | 2 |
| Coating the electrodeposited copper foil | Graphene powder (wt %) | 88 | 88 | 88 | 88 | 88 | 88 | 88 | 88 | 88 | 88 | 88 |
| | Conductive Additive (Conductive Carbon Black; Super P ®) (wt. %) | 3 | 3 | 3 | 3 | 3 | 3 | 3 | 3 | 3 | 3 | 3 |
| | Conductive additive (Graphite; KS6) (wt. %) | 3 | 3 | 3 | 3 | 3 | 3 | 3 | 3 | 3 | 3 | 3 |
| | Water-Based Adhesive Binder (Styrene-Butadiene Rubber; SBR) (wt. %) | 2 | 2 | 2 | 2 | 2 | 2 | 2 | 2 | 2 | 2 | 2 |
| | Thickening Agent (Carboxymethyl Cellulose; CMC) (wt. %) | 4 | 4 | 4 | 4 | 4 | 4 | 4 | 4 | 4 | 4 | 4 |
| | coating speed (M/min) | 5 | 5 | 5 | 5 | 5 | 5 | 5 | 5 | 5 | 5 | 5 |
| | Coating thickness (um) | 30 | 30 | 30 | 30 | 30 | 30 | 30 | 30 | 30 | 30 | 30 |
| | drying temperature (□) | 90 | 90 | 90 | 90 | 90 | 90 | 90 | 90 | 90 | 90 | 90 |
| Pressing the graphene/copper foil composite | Pressing speed (M/min) | 1 | 1 | 1 | 1 | 1 | 1 | 1 | 1 | 1 | 1 | 1 |
| | Pressing pressure (kg) | 1000 | 1000 | 1000 | 1000 | 1000 | 1000 | 1000 | 1000 | 1000 | 1000 | 1000 |

TABLE 4

| | Conditions | \multicolumn{10}{c}{Example} |
| | | 12 | 13 | 14 | 15 | 16 | 17 | 18 | 19 | 20 | 21 |
|---|---|---|---|---|---|---|---|---|---|---|---|
| Manufacture of electrodeposited copper foil (Raw copper foil) | copper sulfate (CuSO$_4$•5H$_2$O) (g/l) | 320 | 320 | 320 | 320 | 320 | 320 | 320 | 320 | 320 | 320 |
| | sulfuric acid (H$_2$SO$_4$) (g/l) | 100 | 100 | 100 | 100 | 100 | 100 | 100 | 100 | 100 | 100 |
| | chloride ion (mg/l) | 35 | 35 | 35 | 35 | 35 | 35 | 35 | 35 | 35 | 35 |
| | temperature (° C.) | 50 | 50 | 50 | 50 | 50 | 50 | 50 | 50 | 50 | 50 |
| | current density (A/dm$^2$) | 50 | 50 | 50 | 50 | 50 | 50 | 50 | 50 | 50 | 50 |
| | gelatin (2CP) concentration (mg/l) | 7.97 | 7.97 | 7.97 | 7.97 | 7.97 | 7.97 | 7.97 | 7.97 | 7.97 | 7.97 |
| | sodium 3-mercapto-1-propanesulfonate (MPS) concentration (mg/l) | 4.33 | 4.33 | 4.33 | 4.33 | 4.33 | 4.33 | 4.33 | 4.33 | 4.33 | 4.33 |
| | Janus green B (JGB) concentration (mg/l) | 1.50 | 1.50 | 1.50 | 1.50 | 1.50 | 1.50 | 1.50 | 1.50 | 1.50 | 1.50 |
| | polishing pressure of buff (A) | 1 | 1 | 1 | 1 | 1 | 1 | 1 | 1 | 1 | 1 |
| | speed of buff (rpm) | 300 | 300 | 300 | 300 | 300 | 300 | 300 | 300 | 300 | 300 |
| | mesh size of buff | 1500 | 1500 | 1500 | 1500 | 1500 | 1500 | 1500 | 1500 | 1500 | 1500 |
| Surface treatment of electrodeposited copper foil (anti-tarnish treatment) | CrO$_3$ (g/l) | 1.5 | 1.5 | 1.5 | 1.5 | 1.5 | 1.5 | 1.5 | 1.5 | 1.5 | 1.5 |
| | pH | 2.03 | 2.03 | 2.03 | 2.03 | 2.03 | 2.03 | 2.03 | 2.03 | 2.03 | 2.03 |
| | Temperature (□) | 25 | 25 | 25 | 25 | 25 | 25 | 25 | 25 | 25 | 25 |
| | Current Density (A/dm$^2$) | 0.5 | 0.5 | 0.5 | 0.5 | 0.5 | 0.5 | 0.5 | 0.5 | 0.5 | 0.5 |
| | Time (Sec) | 2 | 2 | 2 | 2 | 2 | 2 | 2 | 2 | 2 | 2 |

TABLE 4-continued

| | Conditions | Example 12 | 13 | 14 | 15 | 16 | 17 | 18 | 19 | 20 | 21 |
|---|---|---|---|---|---|---|---|---|---|---|---|
| Coating the electrodeposited copper foil | Graphene powder (wt. %) | 88 | 88 | 88 | 88 | 88 | 88 | 88 | 88 | 88 | 88 |
| | Conductive Additive (Conductive Carbon Black; Super P ®) (wt. %) | 3 | 3 | 3 | 3 | 3 | 3 | 3 | 3 | 3 | 3 |
| | Conductive additive (Graphite; KS6) (wt. %) | 3 | 3 | 3 | 3 | 3 | 3 | 3 | 3 | 3 | 3 |
| | Water-Based Adhesive Binder (Styrene-Butadiene Rubber; SBR) (wt. %) | 2 | 2 | 2 | 2 | 2 | 2 | 2 | 2 | 2 | 2 |
| | Thickening Agent (Carboxymethyl Cellulose; CMC) (wt. %) | 4 | 4 | 4 | 4 | 4 | 4 | 4 | 4 | 4 | 4 |
| | coating speed (M/min) | 5 | 5 | 5 | 5 | 5 | 5 | 5 | 5 | 5 | 5 |
| | Coating thickness (um) | 30 | 6 | 60 | 100 | 30 | 30 | 25 | 35 | 30 | 60 |
| | drying temperature (□) | 90 | 90 | 90 | 90 | 90 | 90 | 90 | 90 | 90 | 90 |
| Pressing the graphene/copper foil composite | Pressing speed (M/min) | 1 | 1 | 1 | 1 | 1 | 1 | 1 | 1 | 2 | 3 |
| | Pressing pressure (kg) | 1000 | 1000 | 1000 | 1000 | 1000 | 1000 | 500 | 2000 | 1000 | 1000 |

TABLE 5

| | Conditions | Comparative Example 1 | 2 | 3 | 4 | 5 | 6 | 7 |
|---|---|---|---|---|---|---|---|---|
| Manufacture of electrodeposited copper foil (Raw copper foil) | copper sulfate (CuSO$_4$•5H$_2$O) (g/l) | 320 | 320 | 320 | 320 | 320 | 320 | 320 |
| | sulfuric acid (H$_2$SO$_4$) (g/l) | 100 | 100 | 100 | 100 | 100 | 100 | 100 |
| | chloride ion (mg/l) | 20 | 35 | 35 | 35 | 35 | 35 | 35 |
| | temperature (° C.) | 50 | 50 | 50 | 50 | 50 | 50 | 50 |
| | current density (A/dm$^2$) | 40 | 50 | 50 | 50 | 50 | 50 | 50 |
| | gelatin(2CP) concentration(mg/l) | 0.35 | 6.38 | 6.38 | 6.38 | 7.97 | 7.97 | 7.97 |
| | sodium 3-mercapto-1-propanesulfonate concentration (MPS) (mg/l) | 0.00 | 3.46 | 3.46 | 3.46 | 4.33 | 4.33 | 4.33 |
| | Janus green B (JGB) concentration (mg/l) | 0.00 | 1.20 | 1.20 | 1.20 | 1.50 | 1.50 | 1.50 |
| | polishing pressure of buff (A) | 1 | 0.5 | 0.3 | 1 | 1 | 1 | 1 |
| | speed of buff (rpm) | 300 | 600 | 600 | 300 | 300 | 300 | 300 |
| | mesh size of buff | 1500 | 2000 | 2000 | 1500 | 1500 | 1500 | 1500 |
| Surface treatment of electrodeposited copper foil (anti-tarnish treatment) | CrO$_3$ (g/l) | 1.5 | 1.5 | 1.5 | 10 | 1.5 | 1.5 | 1.5 |
| | pH | 2.03 | 2.03 | 2.03 | 0.95 | 2.03 | 2.03 | 2.03 |
| | Temperature (□) | 25 | 25 | 25 | 25 | 25 | 25 | 25 |
| | Current Density(A/dm$^2$) | 0.5 | 0.5 | 0.5 | 0.5 | 0.5 | 0.5 | 0.5 |
| | Time (Sec) | 2 | 2 | 2 | 2 | 2 | 2 | 2 |
| Coating the electrodeposited copper foil | Graphene powder (wt. %) | 88 | 88 | 88 | 88 | 88 | 88 | 88 |
| | Conductive Additive (Conductive Carbon Black; Super P ®) (wt. %) | 3 | 3 | 3 | 3 | 3 | 3 | 3 |
| | Conductive additive (Graphite; KS6) (wt. %) | 3 | 3 | 3 | 3 | 3 | 3 | 3 |
| | Water-Based Adhesive Binder (Styrene-Butadiene Rubber; SBR) (wt. %) | 2 | 2 | 2 | 2 | 2 | 2 | 2 |
| | Thickening Agent (Carboxymethyl Cellulose; CMC) (wt. %) | 4 | 4 | 4 | 4 | 4 | 4 | 4 |
| | coating speed (M/min) | 5 | 5 | 5 | 5 | 5 | 5 | 5 |
| | Coating thickness (um) | 30 | 30 | 30 | 30 | 5 | 20 | 40 |
| | drying temperature (□) | 90 | 90 | 90 | 90 | 90 | 90 | 90 |
| Pressing the graphene/copper foil composite | Pressing speed (M/min) | 1 | 1 | 1 | 1 | 1 | 1 | 1 |
| | Pressing pressure (kg) | 1000 | 1000 | 1000 | 1000 | 1000 | 500 | 2000 |

Comparison of Examples

TABLE 6

(The comparison of electrodeposited copper foil properties)

| | Example | | | | | | | | | | |
|---|---|---|---|---|---|---|---|---|---|---|---|
| | 1 | 2 | 3 | 4 | 5 | 6 | 7 | 8 | 9 | 10 | 11 |
| Thickness of Copper Foil (μm) | 35.2 | 35.0 | 35.1 | 35.1 | 35.0 | 35.1 | 35.1 | 35.2 | 100.2 | 70.0 | 50.2 |
| Area weight of copper foil (g/m²) | 310.0 | 295.4 | 289.7 | 290.9 | 295.7 | 295.9 | 296.3 | 296.2 | 888.8 | 619.7 | 442.6 |
| Copper content of copper foil (%) | 98.3 | 94.2 | 92.1 | 92.5 | 94.3 | 94.1 | 94.2 | 93.9 | 99.0 | 98.8 | 98.4 |
| Drum side surface roughness (Rz) of copper foil (μm) | 1.10 | 1.12 | 2.48 | 1.86 | 1.16 | 1.15 | 1.11 | 1.20 | 1.13 | 1.23 | 1.27 |
| Deposited side surface roughness (Rz) of copper foil (μm) | 0.62 | 0.83 | 0.68 | 0.65 | 0.86 | 0.80 | 0.61 | 0.98 | 0.31 | 0.42 | 0.46 |
| MD gloss of drum side of copper foil | 77.9 | 78.2 | 75.8 | 29.6 | 78.8 | 77.6 | 179.2 | 79.2 | 86.6 | 72.6 | 75.2 |
| Drum side surface tension of copper foil (dyne/cm) | 62 | 62 | 60 | 60 | 44 | 68 | 62 | 62 | 64 | 62 | 62 |
| Deposited side surface tension of copper foil (dyne/cm) | 62 | 60 | 62 | 62 | 44 | 68 | 62 | 62 | 64 | 64 | 64 |
| Equilibration Temperature (° C.) | 4.1 | 4.6 | 4.4 | 3.9 | 4.9 | 4.3 | 4.9 | 4.7 | 2.6 | 2.8 | 3.2 |
| Dewetting | NO | NO | NO | NO | NO | NO | NO | NO | NO | NO | NO |

Comparative Examples

TABLE 7

(Comparison of electrodeposited copper foil properties)

| | Comparative Example | | | |
|---|---|---|---|---|
| | 1 | 2 | 3 | 4 |
| Thickness of copper foil (μm) | 35.1 | 35.0 | 35.1 | 35.0 |
| Area weight of copper foil (g/m²) | 297.6 | 296.2 | 297.2 | 296.7 |
| Copper content of copper foil (%) | 85.1 | 94.3 | 94.5 | 94.6 |
| Drum side surface roughness (Rz) of copper foil (μm) | 1.12 | 0.76 | 0.56 | 1.15 |
| Deposited side surface roughness (Rz) of copper foil (μm) | 3.78 | 0.87 | 0.88 | 0.86 |
| MD gloss of drum side of copper foil | 78.8 | 102.6 | 212.3 | 80.8 |
| Drum side surface tension of copper foil (dyne/cm) | 62 | 64 | 64 | 40 |
| Deposited side surface tension of copper foil (dyne/cm) | 60 | 62 | 64 | 40 |
| Equilibration Temperature (° C.) | 5.6 | 5.4 | 5.6 | 5.2 |
| Dewetting | NO | NO | NO | YES |

Notes to Table 6 and Table 7

*The graphene layer is coating on the deposited side of the electrodeposited copper foil.

**The thickness of the graphene layer is 15 μm.

***The properties (Surface roughness (Rz) and lightness L*) of graphene layer is the same, only change is in the properties of the electrodeposited copper foil.

****Lower equilibration temperature is good.

Comparison of Examples

TABLE 8

(Comparison of graphene layer properties)

| | Example | | | | | | | | | |
|---|---|---|---|---|---|---|---|---|---|---|
| | 12 | 13 | 14 | 15 | 16 | 17 | 18 | 19 | 20 | 21 |
| Graphene layer coating on copper foil | Deposited side | Deposited side | Deposited side | Deposited side | Drum side | Drum/Deposited sides | Deposited side | deposited side | Deposited side | Deposited side |
| Graphene layer thickness (um) | 15.1 | 3.1 | 30.2 | 49.8 | 15.1 | 15.2 | 15 | 15.1 | 15.1 | 30.3 |
| Roughness (Rz) of graphene layer surface (um) | 1.58 | 1.57 | 1.61 | 1.79 | 1.53 | 1.52 | 1.55 | 1.52 | 3.48 | 8.96 |
| Lightness L* of graphene layer surface | 39.3 | 39.1 | 39.1 | 39.2 | 39.1 | 39.2 | 20.1 | 58.9 | 38.8 | 37.5 |
| Equilibration Temperature (□) | 4.1 | 4.9 | 2.8 | 2.5 | 4.3 | 3.8 | 4.6 | 4.5 | 3.8 | 2.5 |

Comparative Examples

TABLE 9

(Comparison of graphene layer properties)

| | Comparative Example | | |
|---|---|---|---|
| | 5 | 6 | 7 |
| Graphene layer coating on copper foil | Deposited side | Deposited side | Deposited side |
| Graphene layer thickness (um) | 2.4 | 15.1 | 15.1 |
| Roughness (Rz) of graphene layer surface (um) | 1.28 | 1.58 | 1.52 |
| Lightness L* of graphene layer surface | 40.38 | 15.26 | 65.34 |
| Equilibration Temperature (° C.) | 5.7 | 5.3 | 5.2 |

Notes to Table 8 and Table 9
*The thickness of electrodeposited copper foil is 35 um and copper content is about 98%.
**The properties of electrodeposited copper foil is the same, only change is in the properties of the graphene layer.
***Lower equilibration temperature is good.
Test Methods
Copper Content Copper content (%): [area weight $(g/m^2)$/(thickness $(\mu m) \times 8.96^3$ $(g/cm^3))] \times 100$

[3] Theoretical copper density=8.96 $g/cm^3$
(1) Area weight
　1. Cut the copper foil specimen by the size of 100 mm×100 mm.
　2. Use an electronic balance to measure the weight of the copper foil specimen. Electronic balance must be capable of weighing accuracy to ±0.1 mg.
　3. Transfer to area weight by $g/m^2$ unit.
(2) Thickness
　1. The thickness of copper foil is measured by using high accuracy micrometer (Mitutoyo 293-100 MDH-25M). Enabling 0.000005"/0.1 μm resolution measurement.
Roughness
　The measurement was conducted based on the method of JIS B 0601-1994 by using α Type Surface Roughness Measuring Instrument (Kosaka Laboratory Ltd; SE 1700 series).

Gloss
　Gloss was measured using a gloss meter (manufactured by BYK Company; Model No. micro-gloss 60° type) according to JIS Z8741, i.e., by measuring the gloss at the drum side in the machine direction (MD) at a light incident angle of 60°.
Surface Tension
　The surface tension of copper foil was measured using a dyne pen. First, a low value dyne value pen was used on the copper foil. If the ink continuously covers the copper foil surface without breaking, the surface tension of copper foil is larger than this dyne value. Higher dyne value pens are subsequently used to repeat the process. When the ink breaks, the surface tension of the copper foil is determined. The surface tension of surface-treated copper foil of the instant disclosure was in the range of 44 to 68 dyne/cm.
Color L*a*b*
　The color L*a*b* measurements were conducted based on the method of JIS Z 8722 (2000) using a spectrophotometer (Konica Minolta; CM2500c) ("Methods of color measurement—Reflecting and transmitting objects").

In the heat dissipating composites described herein, if the composite is damaged, the individual graphene layer and copper foil components can be salvaged and recycled into new components, something not possible with the prior art graphite sheets.

It should be understood by reference to the foregoing disclosure and embodiments, as well as the Examples, that the disclosure can be applied to numerous other applications, and employed in other variations, all of which should be considered as within our original disclosure.

While particular embodiments of the present invention have been illustrated and described, it would be obvious to those skilled in the art to which this disclosure is directed that various other changes and modifications can be made without departing from the spirit and scope of the appended claims.

I claim:
1. A heat dissipating copper foil comprising:
　(a) a copper content greater than 90%;
　(b) an area weight is in the range of 280 to 900 $(g/m^2)$;
　(c) the copper foil comprising two surfaces, said surface comprising a drum-side and a deposited-side;
　(d) the deposited-side of the copper foil possesses a surface roughness (Rz) that does not exceed 1.0 μm; and

(e) the copper foil exhibits a surface tension in the range of 44 to 68 dyne/cm.

2. The heat dissipating copper foil of claim 1, wherein the surface roughness (Rz) of the drum-side does not exceed 2.5 μm.

3. The heat dissipating copper foil of claim 1, wherein the drum-side of the copper foil exhibits an MD gloss lower than 180 at a light incident angle of 60°.

4. The heat dissipating copper foil of claim 1, wherein the surface roughness (Rz) of the drum-side is in the range of 1.1 to 2.5 μm.

5. The heat dissipating copper foil of claim 1, wherein the surface roughness (Rz) of the deposited-side is in the range of 0.3 to 1.0 μm.

6. The heat dissipating copper foil of claim 1, wherein a lightness value L* of the deposited-side based on the L*a*b* color system, is in the range of 20 to 40.

7. The heat dissipating copper foil of claim 6, wherein the a* value of the deposited-side is in the range of 6 to 11 and b* value of the deposited-side is in the range of 3 to 8, based on the L*a*b* color system.

8. The heat dissipating copper foil of claim 1, wherein the copper foil having a grain size larger than 30 nm.

9. A composite heat dissipating structure comprising the copper foil according to claim 1 further comprising a layer of adhesive, and a pressure consolidated graphene layer, the layer of adhesive being on a surface of the graphene layer opposite the contact of the graphene layer with the copper foil or on a surface of the copper foil opposite the contact of the graphene layer with the copper foil.

10. The composite heat dissipating structure of claim 9, wherein the pressure consolidated graphene layer has a thickness in the range of 3 to 50 μm.

11. The composite heat dissipating structure of claim 9, wherein the graphene layer comprises a surface opposite the copper foil, said graphene layer surface having a lightness value L* in the range of 20 to 60, based on the L*a*b* color system.

12. The composite heat dissipating structure comprising the copper foil according to claim 1, further comprising a pressure consolidated graphene layer in contact with both the drum- and deposited-sides of the copper foil.

13. The composite heat dissipating structure of claim 9, wherein the pressure consolidated graphene layer comprises a water-based adhesive binder, graphene powder, and a conductive material selected from the group consisting of carbon black, graphite and combinations thereof.

14. A composite heat dissipating structure, said structure comprising:
an electrodeposited copper foil, said copper foil having an area weight in the range of 280 to 900 g/m²;
the electrodeposited copper foil comprising two surfaces, said surface comprising a drum-side and a deposited-side;
the deposited-side of the copper foil having a surface roughness (Rz) in the range of 0.3 to 1.0 μm;
the copper foil exhibits a surface tension in the range of 44 to 68 dyne/cm; and,
a graphene layer in combination said copper foil, the graphene layer being in contact with at least the one side of drum-side and deposited-side of the copper foil;
wherein the graphene layer comprises a surface opposite the copper foil, said graphene layer surface having a lightness value L* in the range of 20 to 60, based on the L*a*b* color system.

15. The composite heat dissipating structure of claim 14, further comprising a graphene layer in contact with both the drum- and deposited-sides of the copper foil.

16. The composite heat dissipating structure of claim 14, wherein the drum-side of the copper foil exhibits the surface roughness (Rz) in the range of 1.1 to 2.5 μm.

17. The composite heat dissipating structure of claim 14, wherein the drum-side of the copper foil exhibits an MD gloss lower than 180 at a light incident angle of 60°.

18. The composite heat dissipating structure of claim 14, further comprising a layer of adhesive, the layer of adhesive being on a surface of the graphene layer opposite the contact of the graphene layer with the copper foil or on a surface of the copper foil opposite the contact of the graphene layer with the copper foil.

19. An electronic device comprising the composite heat dissipating structure of claim 1.

20. A method of forming a composite heat dissipating structure, the method comprising:
providing an electrodeposited copper foil according to claim 1 having a drum-side and a deposited-side;
coating a slurry of graphene powder on the deposited-side of the copper foil;
drying the slurry to form a layer of graphene in contact with the deposited-side of the copper foil; the layer of graphene having a first thickness;
reducing the thickness of the layer of graphene layer by consolidating the graphene layer in combination with the copper foil under pressure to form a reduced thickness of graphene in contact with the copper foil; and,
recovering the composite heat dissipating structure.

21. The method of claim 20, further comprising applying a layer of adhesive to the graphene layer after the reducing step.

22. The method of claim 20, further comprising coating a slurry of graphene powder on the drum-side of the copper foil.

23. The method of claim 20, wherein the slurry is an aqueous slurry.

24. The method of claim 20, where the step of reducing the thickness of the graphene layer comprises consolidating the graphene layer with the copper foil at a pressure of at least 1000 kg in a roller press.

* * * * *

UNITED STATES PATENT AND TRADEMARK OFFICE
CERTIFICATE OF CORRECTION

PATENT NO. : 9,709,348 B2
APPLICATION NO. : 15/288346
DATED : July 18, 2017
INVENTOR(S) : Kuei-Sen Cheng Page 1 of 1

It is certified that error appears in the above-identified patent and that said Letters Patent is hereby corrected as shown below:

In the Claims

In Claim 12, the initial word "The" should be deleted and replaced with the word --A--

In Claim 19, the numeral "1" should be deleted and replaced with the numeral --9--

Signed and Sealed this
Sixth Day of March, 2018

Andrei Iancu
*Director of the United States Patent and Trademark Office*